US012787390B2

(12) United States Patent
Kim et al.

(10) Patent No.: US 12,787,390 B2
(45) Date of Patent: Nov. 3, 2026

(54) SEMICONDUCTOR SUBSTRATE, SEMICONDUCTOR DEVICE INCLUDING THE SAME, AND METHOD FOR FABRICATING THE SAME

(71) Applicant: SAMSUNG ELECTRONICS CO., LTD., Suwon-si (KR)

(72) Inventors: Sungmin Kim, Seongnam-si (KR); Yeon Sook Kim, Hwaseong-si (KR); Yoon-Hee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 987 days.

(21) Appl. No.: 18/085,699

(22) Filed: Dec. 21, 2022

(65) Prior Publication Data

US 2023/0215919 A1 Jul. 6, 2023

(30) Foreign Application Priority Data

Dec. 31, 2021 (KR) ........................ 10-2021-0194398

(51) Int. Cl.
*H01L 29/10* (2006.01)
*H01L 27/088* (2006.01)
(Continued)

(52) U.S. Cl.
CPC ........... *H10D 62/371* (2025.01); *H10D 84/83* (2025.01); *H10D 30/43* (2025.01);
(Continued)

(58) Field of Classification Search
CPC ..... H01L 30/014; H01L 30/024; H01L 30/43; H01L 30/62; H01L 30/6211; H01L 30/6212; H01L 30/6213; H01L 30/6219; H01L 30/6713; H01L 30/6735; H01L 30/6757; H01L 30/797; H10D 62/021;
(Continued)

(56) References Cited

U.S. PATENT DOCUMENTS 5,789,286 A 8/1998 Subbanna
6,455,391 B1 9/2002 Villa et al.
(Continued)

FOREIGN PATENT DOCUMENTS

JP 2003-318388 A 11/2003
JP 2004-063894 A 2/2004
(Continued)

*Primary Examiner* — David C Spalla
(74) *Attorney, Agent, or Firm* — Muir Patent Law, PLLC

(57) ABSTRACT

A semiconductor substrate includes a base substrate, a first epitaxial layer having a first conductivity type on the base substrate, a second epitaxial layer having the first conductivity type on the first epitaxial layer, a first well region having a second conductivity type different from the first conductivity type, in the first epitaxial layer and the second epitaxial layer, and a second well region which is spaced apart from the first well region and has the second conductivity type, in the first epitaxial layer and the second epitaxial layer, wherein a doping concentration of the first epitaxial layer is greater than a doping concentration of the second
(Continued)

epitaxial layer, and a depth of each of the first well region and the second well region is greater than a thickness of the second epitaxial layer.

19 Claims, 12 Drawing Sheets

(51) Int. Cl.

| | |
|---|---|
| ***H10D 62/17*** | (2025.01) |
| ***H10D 84/83*** | (2025.01) |
| *H10D 30/43* | (2025.01) |
| *H10D 30/67* | (2025.01) |
| *H10D 62/10* | (2025.01) |

(52) U.S. Cl.
CPC ..... *H10D 30/6735* (2025.01); *H10D 30/6757* (2025.01); *H10D 62/121* (2025.01)

(58) Field of Classification Search
CPC .. H10D 62/118; H10D 62/119; H10D 62/121; H10D 62/149; H10D 62/151; H10D 62/371; H10D 84/013; H10D 84/0158; H10D 84/017; H10D 84/0191; H10D 84/0193; H10D 84/83; H10D 84/834; H10D 84/853
See application file for complete search history.

(56) References Cited

U.S. PATENT DOCUMENTS

| | | | | |
|---|---|---|---|---|
| 7,399,679 | B2 | 7/2008 | Sheu et al. | |
| 8,686,472 | B2 | 4/2014 | Hata | |
| 8,956,942 | B2 | 2/2015 | Loubet et al. | |
| 9,496,135 | B2 | 11/2016 | Cha | |
| 9,691,632 | B2 | 6/2017 | Storck et al. | |
| 9,941,359 | B2 * | 4/2018 | Mears | H10D 62/8171 |
| 11,456,373 | B2 * | 9/2022 | Chan | H10D 30/024 |
| 2016/0254347 | A1 * | 9/2016 | Tsuchiko | H10D 84/0191 257/545 |
| 2020/0006549 | A1 * | 1/2020 | Sadovnikov | H10D 30/603 |
| 2021/0098454 | A1 * | 4/2021 | Yang | H10D 84/0193 |
| 2021/0134959 | A1 | 5/2021 | Barbosa Lima et al. | |

FOREIGN PATENT DOCUMENTS

| | | | |
|---|---|---|---|
| KR | 2001-0031575 | A | 4/2001 |
| KR | 2003-0040951 | | 5/2003 |
| KR | 10-2006-0052881 | A | 5/2006 |
| KR | 10-2006-0123147 | A | 12/2006 |
| KR | 10-2010-0025728 | A | 3/2010 |
| KR | 10-2014-0070015 | A | 6/2014 |
| KR | 1020210028067 | A | 3/2021 |

* cited by examiner

SEMICONDUCTOR SUBSTRATE, SEMICONDUCTOR DEVICE INCLUDING THE SAME, AND METHOD FOR FABRICATING THE SAME

CROSS-REFERENCE TO RELATED APPLICATION

This application claims priority from Korean Patent Application No. 10-2021-0194398, filed on Dec. 31, 2021, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor substrate, a semiconductor device including the same, and a method for fabricating the same. More specifically, embodiments relate to a semiconductor substrate including a well region, a semiconductor device including the same, and a method for fabricating the same.

2. Description of the Related Art

Highly integrated semiconductor devices are required to improve the performance and productivity of semiconductor devices. For such high integration of the semiconductor devices, an interval between well regions, in which electronic elements are formed, may be reduced.

SUMMARY

According to an aspect of the present disclosure, there is provided a semiconductor substrate including a base substrate, a first epitaxial layer having a first conductivity type on the base substrate, a second epitaxial layer having the first conductivity type on the first epitaxial layer, a first well region having a second conductivity type different from the first conductivity type, in the first epitaxial layer and the second epitaxial layer, and a second well region which is spaced apart from the first well region and has the second conductivity type, in the first epitaxial layer and the second epitaxial layer, wherein a doping concentration of the first epitaxial layer is greater than a doping concentration of the second epitaxial layer, and a depth of each of the first well region and the second well region is greater than a thickness of the second epitaxial layer.

According to another aspect of the present disclosure, there is provided a semiconductor substrate including a base substrate having a first conductivity type, a first epitaxial layer having a first conductivity type on the base substrate, a second epitaxial layer having the first conductivity type on the first epitaxial layer, and a well region which extends from an upper surface of the second epitaxial layer toward the base substrate, and has a second conductivity type different from the first conductivity type, wherein a doping concentration of the first epitaxial layer is greater than a doping concentration of the second epitaxial layer, a thickness of the first epitaxial layer is 0.1 μm to 2.0 μm, a thickness of the second epitaxial layer is 0.1 μm to 1.0 μm, and a depth of the well region is greater than a thickness of the second epitaxial layer.

According to still another aspect of the present disclosure, there is provided a semiconductor device including a second epitaxial layer having the first conductivity type on the first epitaxial layer, a first well region having a second conductivity type different from the first conductivity type, in the first epitaxial layer and the second epitaxial layer, and a first element on the first well region, wherein the first element includes a plurality of active patterns which are sequentially stacked on the first epitaxial layer and spaced apart from each other, a gate electrode which intersects each of the active patterns and surrounds side surfaces of each of the active patterns, and a source/drain region connected to each of the active patterns and having the first conductivity type, on side surfaces of the gate electrode, wherein a doping concentration of the first epitaxial layer is greater than a doping concentration of the second epitaxial layer, and a depth of the first well region is greater than a thickness of the second epitaxial layer.

BRIEF DESCRIPTION OF DRAWINGS

Features will become apparent to those of skill in the art by describing in detail exemplary embodiments with reference to the attached drawings in, which.

DETAILED DESCRIPTION

Figure 1:
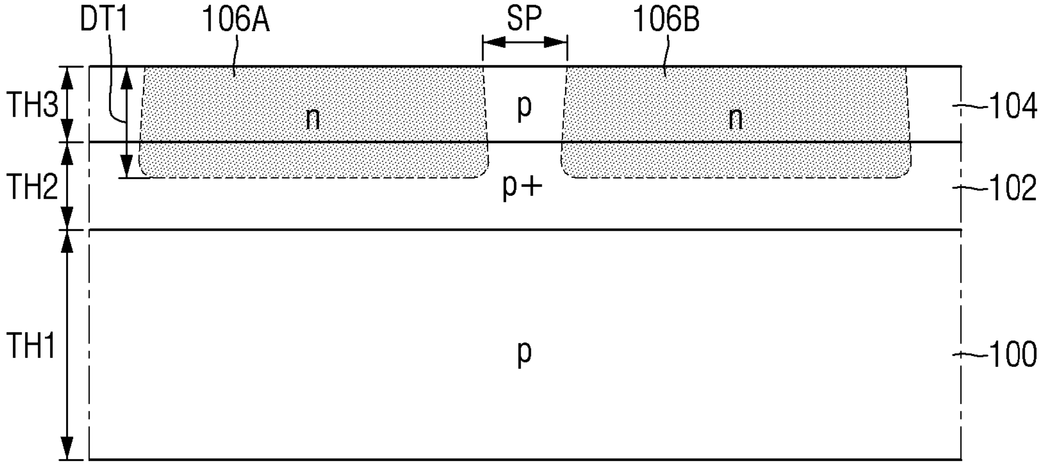
FIG. 1 is a schematic cross-sectional view of a semiconductor substrate according to some embodiments.

Hereinafter, a semiconductor substrate according to exemplary embodiments will be described referring to FIG. 1. FIG. 1 is a schematic cross-sectional view of a semiconductor substrate according to some embodiments.

Referring to FIG. 1, a semiconductor substrate according to some embodiments may include a base substrate 100, a first epitaxial layer 102, a second epitaxial layer 104, and well regions 106A and 106B.

For example, the base substrate 100 may be bulk silicon or silicon-on-insulator (SOI). For example, the base substrate 100 may be a silicon substrate or may include other materials, e.g., silicon germanium, silicon germanium on insulator (SGOI), indium antimonide, lead tellurium compounds, indium arsenide, indium phosphide, gallium arsenide or gallium antimonide. As an example, the base substrate 100 will be described below as a single crystal silicon substrate. A thickness TH1 of the base substrate 100, e.g., along a vertical direction perpendicular to the upper surface of the base substrate 100, may be, e.g., from about 500 μm to about 1000 μm.

The base substrate 100 may have a predetermined plane direction. For example, the base substrate 100 may include at least one of a {100} crystal plane, a {110} crystal plane, and a {111} crystal plane, e.g., the base substrate 100 may have the {100} crystal plane.

In some embodiments, the base substrate 100 may have a first conductivity type. For example, the base substrate 100 may include impurities of the first conductivity type. In the following embodiments, the first conductivity type is described as a p-type. As an example, the base substrate 100 may include p-type impurities (e.g., boron (B), gallium (Ga), indium (In), aluminum (Al), or the like). However, this is merely an example, e.g., the first conductivity type may be an n-type. A doping concentration of the base substrate 100 may be, e.g., about 1E15 $cm^{-3}$. Here, the doping concentration refers to the concentration of impurities to be doped (or injected), e.g., in units of $cm^{-3}$ (atoms/$cm^3$).

The first epitaxial layer 102 may be formed on the base substrate 100. The first epitaxial layer 102 may be in, e.g., direct, contact with an upper surface of the base substrate 100. The first epitaxial layer 102 may be formed from the base substrate 100 by an epitaxial growth process. For example, the first epitaxial layer 102 may be formed by an APCVD (Atmospheric Pressure Chemical Vapor Deposition), an LPCVD (Low (or reduced) Pressure Chemical Vapor Deposition), a UHV-CVD (Ultra High Vacuum Chemical Vapor Deposition), a MBE (Molecular Beam Epitaxy), a MOCVD (Metal Organic Chemical Vapor Deposition), and the like.

For example, the first epitaxial layer 102 may include silicon (Si) or germanium (Ge), which are elemental semiconductor materials. In another example, the first epitaxial layer 102 may include a compound semiconductor, e.g., a group IV-IV compound semiconductor or a group III-V compound semiconductor. The group IV-IV compound semiconductor may include, e.g., a binary compound or a ternary compound including at least two or more of carbon (C), silicon (Si), germanium (Ge) and tin (Sn), or a compound obtained by doping these elements with a group IV element. The group III-V compound semiconductor may be, e.g., at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some embodiments, the first epitaxial layer 102 may include the same semiconductor material as the base substrate 100. For example, when the base substrate 100 is a single crystal silicon substrate, the first epitaxial layer 102 may include single crystal silicon. In some other embodiments, the first epitaxial layer 102 may include a different semiconductor material from the base substrate 100.

The first epitaxial layer 102 may have the first conductivity type. As an example, the first epitaxial layer 102 may include p-type impurities (e.g., boron (B), gallium (Ga), indium (In), aluminum (Al), or the like).

In some embodiments, the first epitaxial layer 102 may have a plane direction similar to that of the base substrate 100. For example, when the base substrate 100 has a (100) crystal plane, the first epitaxial layer 102 may have the (100) crystal plane.

The second epitaxial layer 104 may be formed on the first epitaxial layer 102. The second epitaxial layer 104 may be in, e.g., direct, contact with the upper surface of the first epitaxial layer 102. The second epitaxial layer 104 may be formed from the first epitaxial layer 102 by an epitaxial growth process. For example, the second epitaxial layer 104 may be formed by an APCVD (Atmospheric Pressure Chemical Vapor Deposition), a LPCVD (Low (or reduced) Pressure Chemical Vapor Deposition), a UHV-CVD (Ultra High Vacuum Chemical Vapor Deposition), a MBE (Molecular Beam Epitaxy), a MOCVD (Metal Organic Chemical Vapor Deposition), and the like.

For example, the second epitaxial layer 104 may include silicon (Si) or germanium (Ge), which are elemental semiconductor materials. In another example, the second epitaxial layer 104 may include a compound semiconductor, e.g., a group IV-IV compound semiconductor or a group III-V compound semiconductor.

In some embodiments, the second epitaxial layer 104 may include the same semiconductor material as the first epitaxial layer 102. For example, when the first epitaxial layer 102 includes single crystal silicon, the second epitaxial layer 104 may include single crystal silicon. In some other embodiments, the second epitaxial layer 104 may include a different semiconductor material from the first epitaxial layer 102.

The second epitaxial layer 104 may have the first conductivity type. As an example, the second epitaxial layer 104 may include p-type impurities (e.g., boron (B), gallium (Ga), indium (In), aluminum (Al), or the like).

In some embodiments, the second epitaxial layer 104 may have a doping concentration of a level similar to that of the base substrate 100. For example, the doping concentration of the second epitaxial layer 104 may be from about 1E11 $cm^{-3}$ to about 1E17 $cm^{-3}$, e.g., the doping concentration of the second epitaxial layer 104 may be from about 1E13 $cm^{-3}$ to about 1E17 $cm^{-3}$ or from about 1E14 $cm^{-3}$ to about 1E16 $cm^{-3}$.

The first epitaxial layer 102 may have a doping concentration of a relatively higher level than the base substrate 100 and/or the second epitaxial layer 104. For example, the doping concentration of the first epitaxial layer 102 may be from about 1E16 $cm^{-3}$ to about 1E21 $cm^{-3}$, the doping concentration of the first epitaxial layer 102 may be from about 1E17 $cm^{-3}$ to about 1E+20 $cm^{-3}$ or about 1E18 $cm^{-3}$ to about 1E+20 $cm^{-3}$.

The well regions 106A and 106B may be formed in the first epitaxial layer 102 and the second epitaxial layer 104. Each of the well regions 106A and 106B may extend from the upper surface of the second epitaxial layer 104 toward the base substrate 100. For example, the well regions 106A and 106B may be impurity regions formed by ion-implanting impurities into the first epitaxial layer 102 and the second epitaxial layer 104.

A depth DT1 at which each of the well regions 106A and 106B is formed may be greater than a thickness TH3 of the second epitaxial layer 104. That is, a lower surface of each of the well regions 106A and 106B may be disposed below a lower surface of the second epitaxial layer 104, e.g., relative to a bottom of the base substrate 100. For example, as illustrated in FIG. 1, each of the well regions 106A and 106B may extend continuously from the upper surface of the second epitaxial layer 104 through the entire thickness of the second epitaxial layer 104 and at least partially into the first epitaxial layer 102. The depth DT1 of each of the well regions 106A and 106B may be, e.g., from about 0.4 μm to about 1.0 μm.

For example, as illustrated in FIG. 1, the lower surface of each of the well regions 106A and 106B may be between the lower surface of the first epitaxial layer 102 and the upper surface of the first epitaxial layer 102. In another example, the lower surface of each of the well regions 106A and 106B may be disposed below the lower surface of the first epitaxial layer 102, e.g., the lower surface of each of the well regions 106A and 106B may be between the upper and lower surfaces of the base substrate 100.

The well regions 106A and 106B may have a second conductivity type different from the first conductivity type. For example, the well regions 106A and 106B may include impurities of the second conductivity type. In the following embodiments, the second conductivity type is described as an n-type. In an example, the well regions 106A and 106B may include n-type impurities (e.g., phosphorus (P), arsenic (As), antimony (Sb), and bismuth (Bi)). However, this is merely an example, and the second conductivity type may be a p-type.

The well regions 106A and 106B may include a first well region 106A and a second well region 106B that are spaced apart from each other in a horizontal direction (e.g., a direction parallel to the upper surface of the base substrate 100). In some embodiments, a separation distance SP between the first well region 106A and the second well region 106B may be about 0.15 μm or less, e.g., the separation distance SP between the first well region 106A and the second well region 106B may be from about 0.01 μm to about 0.15 μm. For example, as illustrated in FIG. 1, the separation distance SP may be measured between facing sidewalls of the first well region 106A and the second well region 106B along the upper surface of the second epitaxial layer 104.

In some embodiments, the width of each of the well regions 106A and 106B may increase toward the base substrate 100. Here, the width means a width in the horizontal direction (e.g., a direction parallel to the upper surface of the base substrate 100). This may be due to the characteristics of the ion implantation process for forming the well regions 106A and 106B. The cross-section of each of the well regions 106A and 106B may have any suitable shape, e.g., a parallelogram, a pot shape with a wide bottom, etc.

The well regions 106A and 106B may provide a body of a semiconductor element formed on the second epitaxial layer 104. For example, a semiconductor element having the first conductivity type may be formed on each of the well regions 106A and 106B. As an example, when the well regions 106A and 106B include n-type impurities, the semiconductor element formed on the well regions 106A and 106B may be the p-type.

A thickness TH2 of the first epitaxial layer 102, e.g., along the vertical direction, may be smaller than the thickness TH1 of the base substrate 100. For example, the thickness TH2 of the first epitaxial layer 102 may be about 0.1 μm or more, e.g., about 0.1 μm to about 2.0 μm or about 0.5 μm to about 2.0 μm. When the thickness TH2 of the first epitaxial layer 102 is smaller than about 0.1 μm, the first epitaxial layer 102 may not effectively block the leakage path between the well regions 106A and 106B. This will be described more specifically below with reference to FIGS. 4 and 5. When the thickness TH2 of the first epitaxial layer 102 is greater than about 2.0 μm, the productivity of the semiconductor substrate may decrease.

A thickness TH3 of the second epitaxial layer 104, e.g., along the vertical direction, may be smaller than the thickness TH1 of the base substrate 100. For example, the thickness TH3 of the second epitaxial layer 104 may be about 0.1 μm or more, e.g., about 0.1 μm to about 1.0 μm. When the thickness TH3 of the second epitaxial layer 104 is smaller than about 0.1 μm, the second epitaxial layer 104 may provide an insufficient body for the semiconductor element formed on the second epitaxial layer 104. When the thickness TH3 of the second epitaxial layer 104 is greater than about 1.0 μm, the leakage path between the well regions 106A and 106B may not be effectively blocked. This will be described more specifically below with reference to FIGS. 4 and 5.

For example, as illustrated in FIG. 1, the thickness TH3 of the second epitaxial layer 104 may be smaller than the thickness TH2 of the first epitaxial layer 102. In another example, the thickness TH3 of the second epitaxial layer 104 may be greater than the thickness TH2 of the first epitaxial layer 102.

Figure 2:
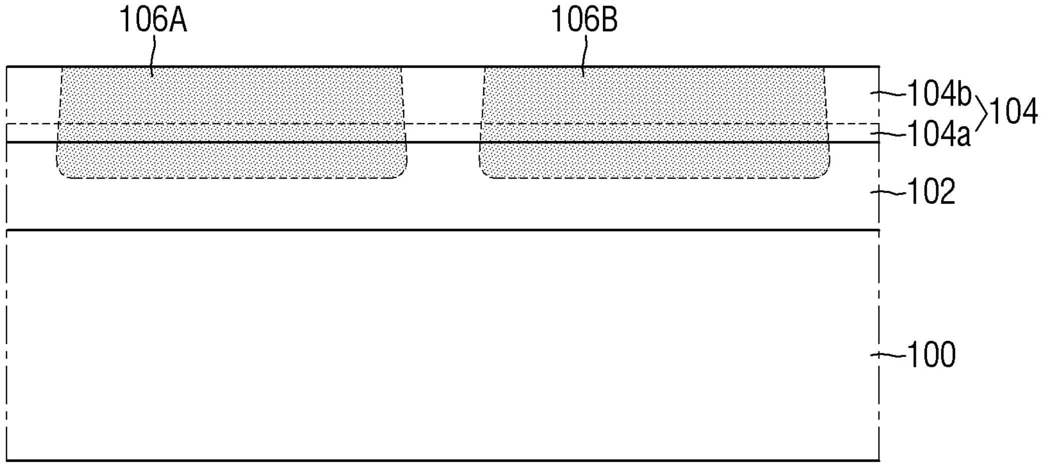
FIG. 2 is a schematic cross-sectional view of a semiconductor substrate according to some embodiments.
Figure 3:
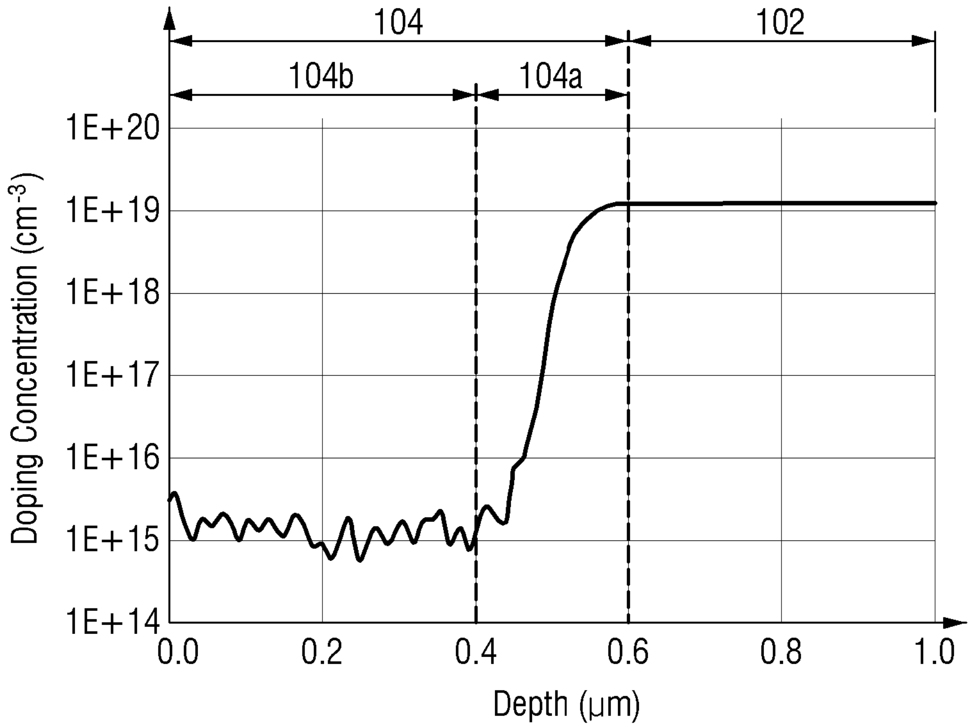
FIG. 3 is a graph of a doping concentration of the semiconductor substrate of FIG. 2.

FIG. 2 is a schematic cross-sectional view of a semiconductor substrate according to some embodiments. FIG. 3 is an exemplary graph for explaining the doping concentration of the semiconductor substrate of FIG. 2. For reference, FIG. 3 shows a concentration of boron (B) injected into the first epitaxial layer 102 and the second epitaxial layer 104 of FIG. 2, depending on the depth measured from the upper surface of the second epitaxial layer 104, e.g., the Y axis of the graph at 0.0 μm represents the upper surface of the second epitaxial layer 104. For convenience of explanation, parts of contents previously explained with reference to FIG. 1 will be only briefly described or omitted.

Referring to FIGS. 2 and 3, in a semiconductor substrate according to some embodiments, the second epitaxial layer 104 may include a transition layer **104*a* and a body layer 104*b***.

The transition layer **104*a* may be interposed between the first epitaxial layer 102 and the body layer 104*b*. The transition layer 104*a* may be a boundary layer formed by diffusing impurities of the first epitaxial layer 102 into the second epitaxial layer 104 adjacent to the first epitaxial layer 102. As an example, the transition layer 104*a* may be formed by diffusing the p-type impurities injected into the first epitaxial layer 102 into the second epitaxial layer 104. The body layer 104*b* may be a region that is spaced apart from the first epitaxial layer 102 to prevent diffusion of impurities of the first epitaxial layer 102**.

As described above, because the doping concentration of the first epitaxial layer 102 may be higher than the doping concentration of the second epitaxial layer 104, the doping concentration of the transition layer **104*a* may increase from the body layer 104*b* toward the first epitaxial layer 102. For example, as shown in FIG. 3, the doping concentration of boron (B) injected into the body layer 104*b* may be kept substantially constant at about 1E15 $cm^{-3}$. Further, the doping concentration of boron (B) injected into the first epitaxial layer 102 may be kept substantially constant at about 1E19 $cm^{-3}$. At this time, the doping concentration of boron (B) injected into the transition layer 104*a* may, e.g., gradually, increase from about 1E15 $cm^{-3}$ to about 1E19 $cm^{-3}$ toward the first epitaxial layer 102 from the body layer 104*b***.

Figure 4:
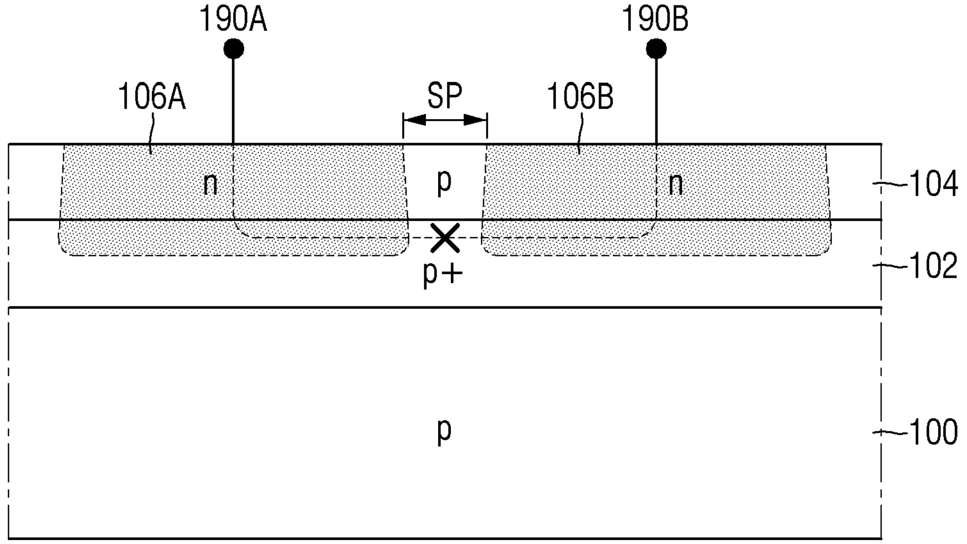
FIG. 4 is a diagram of a performance of a semiconductor substrate according to some embodiments.

FIG. 4 is a diagram for explaining the performance of a semiconductor substrate according to some embodiments. For convenience of explanation, parts of contents previously explained with reference to FIGS. 1 to 3 will be only briefly described or omitted.

Referring to FIG. 4, if a single epitaxial layer were to be formed on the base substrate 100, such a single epitaxial layer would have been formed, e.g., grown, from the base substrate 100 by the epitaxial growth process, thereby having the first conductivity type, e.g., both the base substrate 100 and the single epitaxial layer would have included p-type impurities, and the same doping concentration as that of the base substrate 100, e.g., about 1E13 $cm^{-3}$ to about 1E17 $cm^{-3}$. Further, if well regions with a second conductivity type, e.g., n-type impurities, were to be formed in the single epitaxial layer, i.e., in a highly integrated semiconductor device with a decreased interval (e.g., SP) between the well regions, application of voltage to contacts on respective adjacent well regions, e.g., well regions with an interval SP of about 0.15 μm or less, would have caused a leakage path between the adjacent well regions. In particular, when a bottom of each well region may have an increased width toward the base substrate 100, the leakage path may be deepened between the lower parts of the adjacent well regions.

In contrast, as illustrated in FIG. 4, a semiconductor substrate according to example embodiments may be configured to block the leakage path between adjacent well regions with a decreased interval therebetween, i.e., between the well regions 106A and 106B. That is, a semiconductor substrate according to example embodiments may include two epitaxial layers stacked on top of the base substrate 100, such that a doping concentration in the bottom epitaxial layer (which contains the wider bottoms of the wells regions) may be higher than that of the base substrate 100, thereby effectively blocking the leakage path between the adjacent well regions.

In detail, as described above with reference to FIGS. 1 to 3, the semiconductor substrate according to some embodiments may include the first epitaxial layer 102 and the second epitaxial layer 104 that are sequentially stacked on the base substrate 100, with each of the well regions 106A and 106B, having the second conductivity type, being formed to be deeper than the thickness TH3 of the second epitaxial layer 104. Therefore, the lower parts of each of the well regions 106A and 106B may be formed in the first epitaxial layer 102. Further, since the first epitaxial layer 102 may have the first conductivity type different from the second conductivity type of the well regions 106A and 106B, and may have a doping concentration of a relatively higher level than that of the base substrate 100 and/or the second epitaxial layer 104, the first epitaxial layer 102 may effectively block the leakage path formed between the lower part of the first well region 106A and the lower part of the second well region 106B when voltage is applied by a first well contact 190A and a second well contact 190B.

In some embodiments, the thickness TH2 (FIG. 1) of the first epitaxial layer 102 and/or the thickness TH3 (FIG. 1) of the second epitaxial layer 104 may be controlled depending on the depth at which the leakage path between the well regions 106A and 106B is formed. For example, when the separated distance SP between the first well region 106A and the second well region 106B is about 0.15 μm or less, the leakage path between the first well region 106A and the second well region 106B may be formed at a depth of about 0.4 μm to about 1.5 μm from the upper surface of the second epitaxial layer 104. Therefore, the thickness TH3 (FIG. 1) of the second epitaxial layer 104 may be formed to be, e.g., about 0.1 μm to about 1.0 μm, from the upper surface of the second epitaxial layer 104, i.e., at a distance from the upper surface of the second epitaxial layer 104 that is smaller than the depth of the leakage path. Further, the first epitaxial layer 102 may be formed to have a thickness of, e.g., about 0.1 μm to about 2.0 μm, for efficiently blocking a potential leakage path between the lower part of the first well region 106A and the lower part of the second well region 106B.

Hereinafter, a semiconductor device including the semiconductor substrate according to exemplary embodiments will be described referring to FIGS. 1 to 8.

Figure 5:
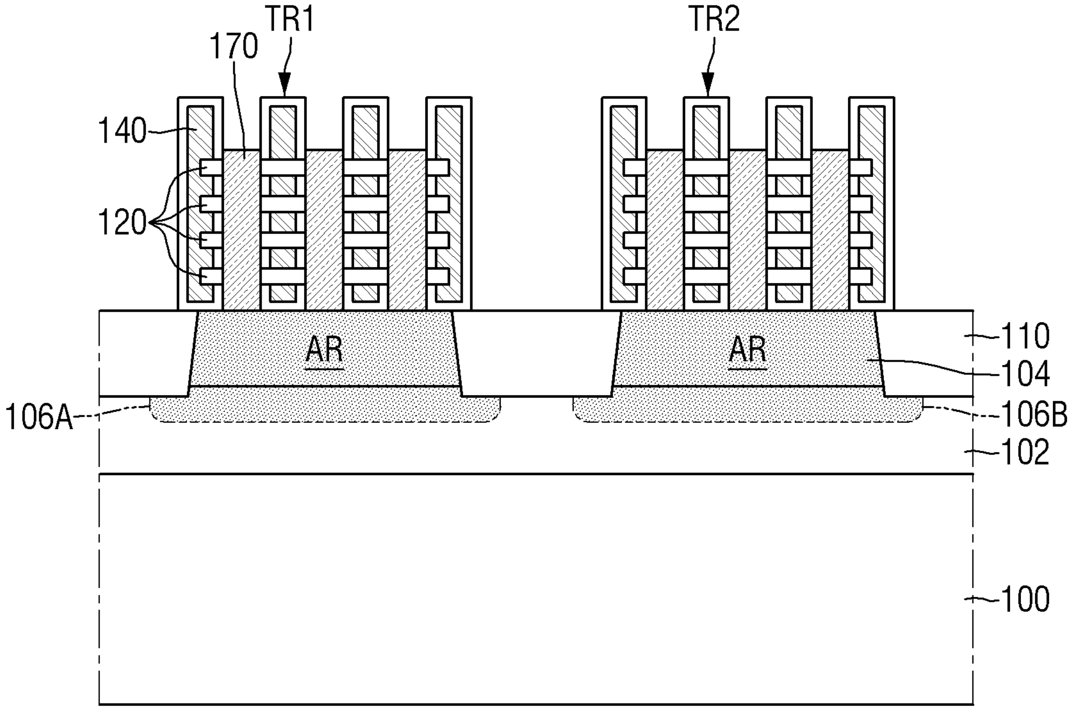
FIG. 5 is a schematic cross-sectional view of a semiconductor device including a semiconductor substrate according to some embodiments.
Figure 6:
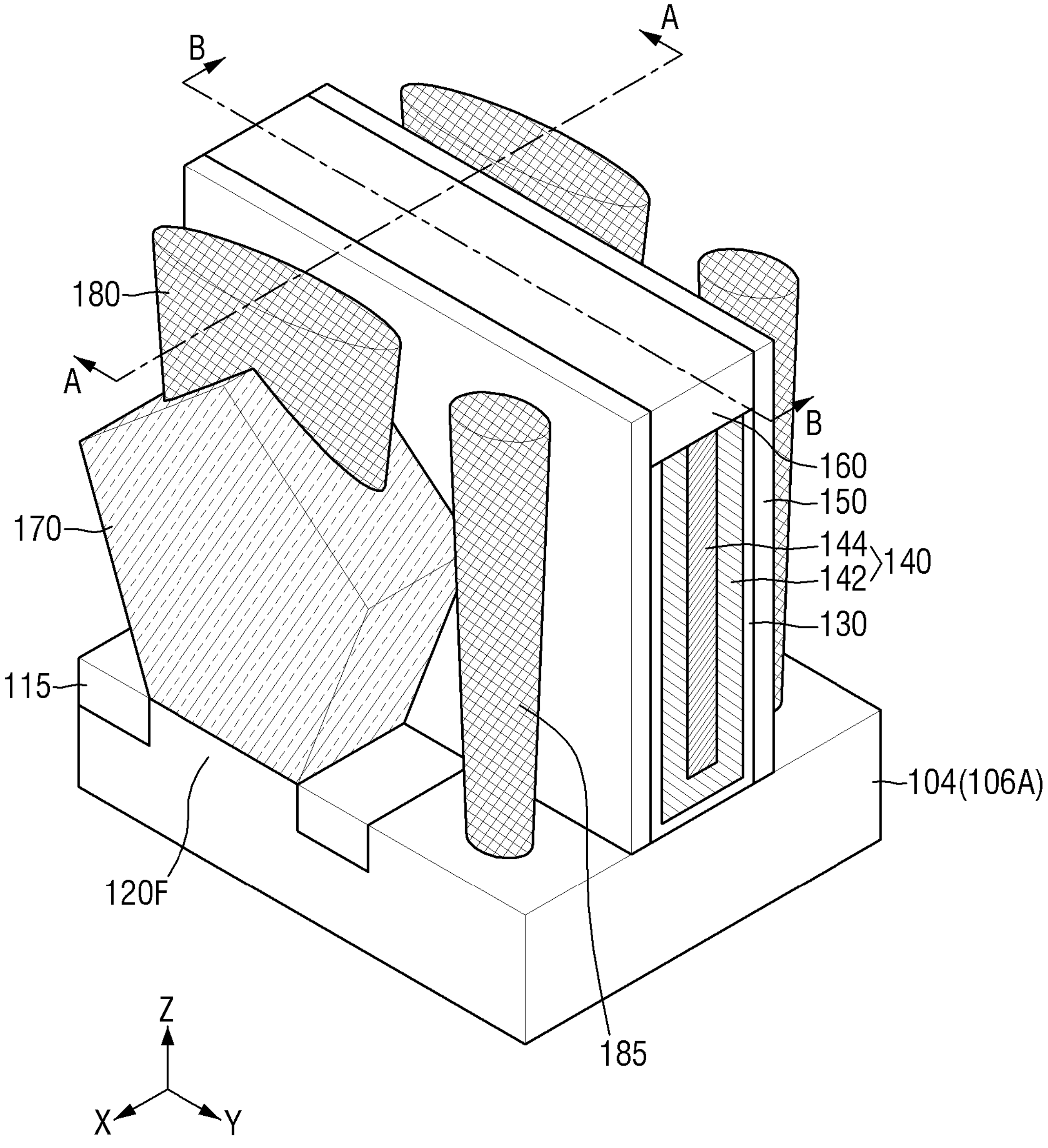
FIG. 6 is a partial perspective view of the semiconductor device of FIG. 6.
Figure 7:
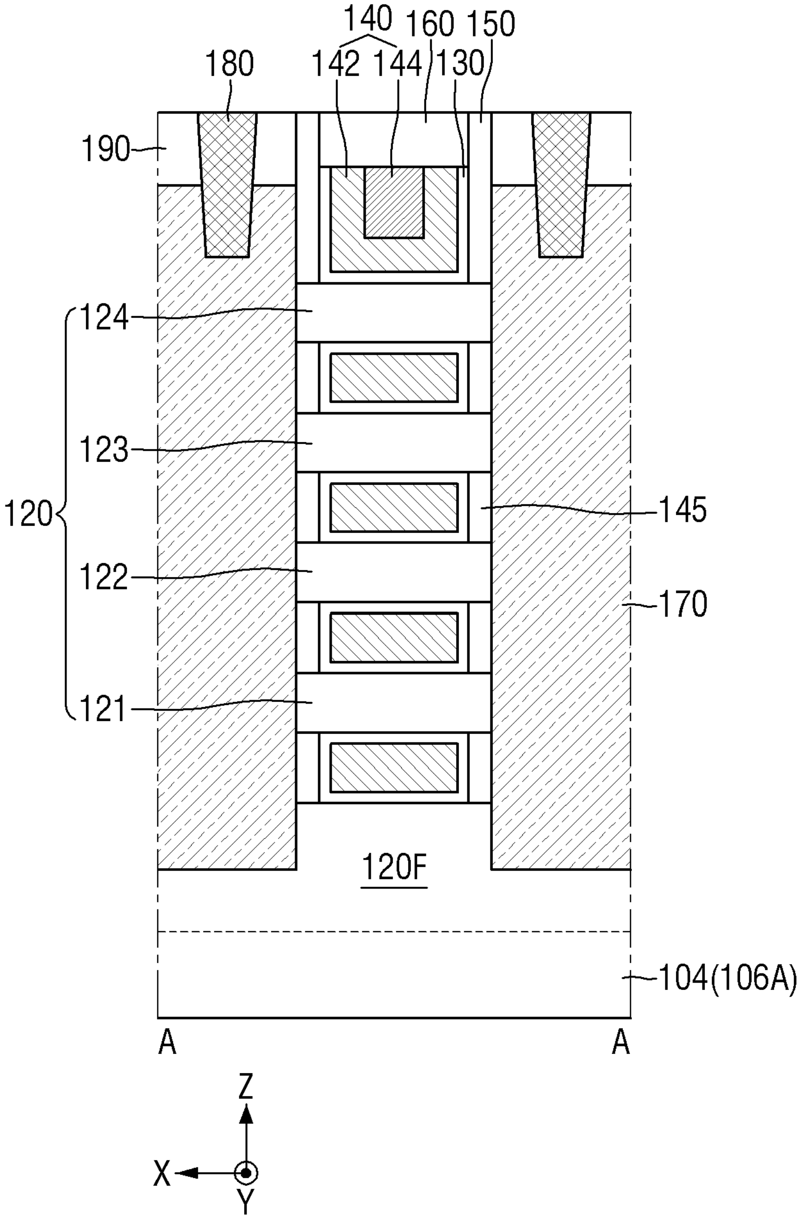
FIG. 7 is a cross-sectional view taken along line A-A of FIG. 6.
Figure 8:
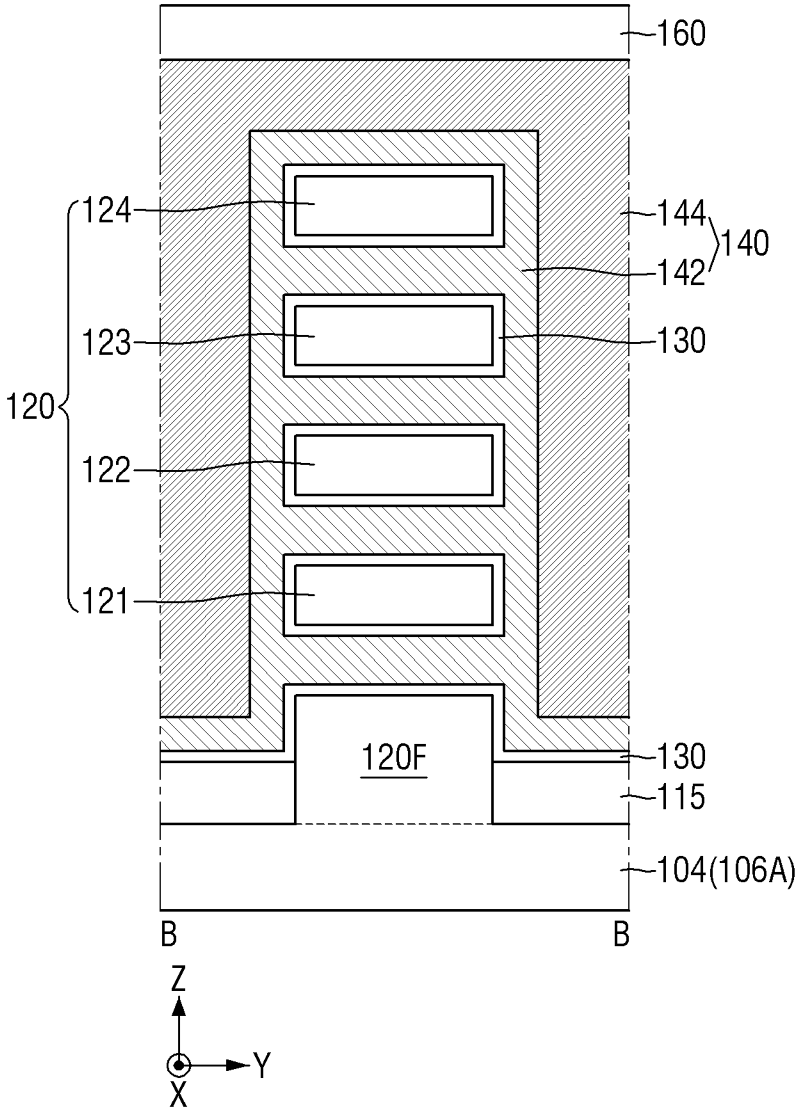
FIG. 8 is a cross-sectional view taken along line B-B of FIG. 6.

FIG. 5 is a schematic cross-sectional view of a semiconductor device which includes a semiconductor substrate according to some embodiments. FIG. 6 is a partial perspective view of the semiconductor device of FIG. 5. FIG. 7 is a cross-sectional view taken along line A-A of FIG. 6. FIG. 8 is a cross-sectional view taken along line B-B of FIG. 6. For convenience of explanation, parts described previously with reference to FIGS. 1 to 5 will be only briefly described or omitted.

In FIGS. 5 to 8, although only MBCFET® including a multi-bridge channel has been described as the semiconductor device including a semiconductor substrate according to exemplary embodiments, this is merely an example. As another example, a semiconductor device according to some embodiments may include a multi-gate transistor, a tunneling field effect transistor (tunneling FET), a vertical field effect transistor (vertical FET; VFET) or a CFET (Complementary FET) that includes a three-dimensional (3D) channel region, e.g., a fin pattern, a nanowire pattern or a nanosheet pattern. In another example, a semiconductor device according to some embodiments may include a bipolar junction transistor, a laterally diffused metal oxide semiconductor (LDMOS), and the like.

Referring to FIG. 5, a semiconductor device according to some embodiments may include the base substrate 100, the first epitaxial layer 102, the second epitaxial layer 104, the well regions 106A and 106B, an element separation pattern 110, and electronic elements TR1 and TR2.

The element separation pattern 110 may define a plurality of active regions AR in the second epitaxial layer 104. For example, the element separation pattern 110 may be formed by embedding an insulating material in a shallow trench formed by patterning the second epitaxial layer 104. Such an element separation pattern 110 may extend from the upper surface of the second epitaxial layer 104. The element separation pattern 110 may define the active regions AR in the second epitaxial layer 104 by forming a plurality of isolation regions. The element separation pattern 110 may include, e.g., at least one of silicon oxide, silicon nitride, silicon oxynitride, and combinations thereof.

For example, as illustrated in FIG. 5, the lower surface of the element separation pattern 110 may be formed to be lower than the lower surface of the second epitaxial layer 104 and higher than the lower surface of the first epitaxial layer 102. In another example, the lower surface of the element separation pattern 110 may be formed to be higher than the lower surface of the second epitaxial layer 104, or may be formed to be lower than the lower surface of the first epitaxial layer 102.

The active region AR may be defined in at least a part of the well regions 106A and 106B. For example, the element separation pattern 110 may be patterned to expose at least a part of the well regions 106A and 106B in the second epitaxial layer 104.

The electronic elements TR1 and TR2 may be formed on the active regions AR of the second epitaxial layer 104. The electronic elements TR1 and TR2 may be spaced apart from each other by the element separation pattern 110 that defines the active regions AR. The well regions 106A and 106B in the active region AR may provide the body of the electronic elements TR1 and TR2 formed on the second epitaxial layer 104. For example, the electronic elements TR1 and TR2 may include a first element TR1 formed on the first well region 106A and a second element TR2 formed on the second well region 106B.

In some embodiments, at least one of the electronic elements TR1 and TR2 may include an MBCFET® that includes a multi-bridge channel. For example, the first element TR1 and the second element TR2 may each include a plurality of active patterns 120, a gate electrode 140, and a source/drain region 170. The active patterns 120, the gate electrode 140, and the source/drain region 170 will be described more specifically with reference to FIGS. 6 to 8.

For example, as illustrated in FIG. 5, the first element TR1 and the second element TR2 may include the MBCFET®. In another example, only one of the first element TR1 and the second element TR2 may include the MBCFET®, and the other of the first element TR1 and the second element TR2 may include another electronic element (e.g., a fin type field effect transistor (FinFET)).

Referring to FIGS. 6 to 8, the semiconductor device according to some embodiments may include the plurality of active patterns 120, a gate dielectric film 130, the gate electrode 140, a gate spacer 150, a gate capping film 160, the source/drain region 170, a source/drain contact 180, a body contact 185, and an interlayer insulating film 190. For reference, the interlayer insulating film 190 is not shown in FIG. 6.

The plurality of active patterns 120 may be formed on the well regions 106A and 106B in the second epitaxial layer 104. The active patterns 120 may be spaced apart from the second epitaxial layer 104, e.g., along the vertical direction (i.e., a third direction Z). Further, the active patterns 120 may be spaced apart from each other and extend in a first direction X parallel to the upper surface of the second epitaxial layer 104. As an example, the active patterns 120 may include first to fourth sheet patterns 121 to 124 that are sequentially stacked on the second epitaxial layer 104 and spaced apart from each other, e.g., in the third direction Z. The first to fourth sheet patterns 121 to 124 may be arranged sequentially along a vertical direction (i.e., the third direction Z) intersecting the upper surface of the second epitaxial layer 104.

In some embodiments, the second epitaxial layer 104 may include a fin pattern 120F. The fin pattern 120F may protrude from the upper surface of the second epitaxial layer 104 and extend in the first direction X. The fin pattern 120F may be formed by etching a part of the second epitaxial layer 104, or may be an epitaxial layer that is grown from the second epitaxial layer 104.

The active patterns 120 may include silicon (Si) or germanium (Ge), which is each an elemental semiconductor material. Alternatively, the active patterns 120 may include a compound semiconductor, e.g., a group IV-IV compound semiconductor or a group III-V compound semiconductor, respectively. Each active pattern 120 may include the same semiconductor material as the second epitaxial layer 104, and may include a different semiconductor material from the second epitaxial layer 104.

In some embodiments, a field insulating film 115 may be formed on the second epitaxial layer 104. The field insulating film 115 may cover at least a part of the side surface of the fin pattern 120F. For example, as illustrated in FIG. 8, the uppermost part of the fin pattern 120F may protrude from, e.g., above, the upper surface of the field insulating film 115. In another example, the upper surface of the field insulating film 115 may be disposed on the same surface as the uppermost surface of the fin pattern 120F, e.g., the upper surfaces of the field insulating film 115 and the fin pattern 120 may be coplanar. The field insulating film 115 may include, e.g., at least one of silicon oxide, silicon nitride, silicon oxynitride, and combinations thereof.

The gate electrode 140 may be formed on the well regions 106A and 106B in the second epitaxial layer 104. For example, the gate electrode 140 may extend along the upper surface of the second epitaxial layer 104 and the upper surface of the field insulating film 115. The gate electrode 140 may intersect the active patterns 120. For example, the gate electrode 140 may extend in a second direction Y that is parallel to the upper surface of the second epitaxial layer 104 and intersects the first direction X. Each active pattern 120 may extend in the first direction X and penetrate the gate electrode 140. For example, the gate electrode 140 may surround the side surfaces of each of the first to fourth sheet patterns 121 to 124.

For example, the gate electrode 140 may include a conductive material, e.g., at least one of titanium (Ti), tantalum (Ta), tungsten (W), aluminum (Al), cobalt (Co), and combinations thereof. In another example, the gate electrode 140 may include silicon, silicon germanium, or the like other than metal. Such a gate electrode 140 may be formed, e.g., by the replacement process.

In some embodiments, the gate electrode 140 may include a work function adjusting film 142 that adjusts a work function, and a filling conductive film 144 that fills a space formed by the work function adjusting film 142. The work function adjusting film 142 and the filling conductive film 144 may be sequentially stacked on the gate dielectric film 130. The work function adjusting film 142 may include, e.g., at least one of TiN, TaN, TiC, TaC, TiAlC, and combinations thereof. The filling conductive film 144 may include, e.g., W or Al.

The gate dielectric film 130 may be interposed between the second epitaxial layer 104 and the gate electrode 140, and between the active patterns 120 and the gate electrode 140. For example, the gate dielectric film 130 may be stacked on the second epitaxial layer 104 and the active patterns 120. The gate dielectric film 130 may surround the side surfaces of each active pattern 120. The gate dielectric film 130 may extend along the upper surface of the field insulating film 115 and the surface of the fin pattern 120F protruding from the field insulating film 115.

The gate dielectric film 130 may include, e.g., at least one of silicon oxide, silicon oxynitride, silicon nitride or a high dielectric constant material having a higher dielectric constant than silicon oxide. The high dielectric constant material may include, e.g., one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or combinations thereof.

For example, an interfacial film may be formed between the active patterns 120 and the gate dielectric film 130. The interfacial film may include, e.g., a silicon oxide film.

For example, a semiconductor device according to some other embodiments may include an NC (Negative Capacitance) FET that uses a negative capacitor. For example, the gate dielectric film 130 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., at least one of gadolinium (Gd), silicon (Si), zirconium (Zr), aluminum (Al), and yttrium (Y).

When the dopant is aluminum (Al), the ferroelectric material film may include 3 at % (atomic %) to 8 at % aluminum. Here, a ratio of the dopant may be a ratio of aluminum to the sum of hafnium and aluminum.

When the dopant is silicon (Si), the ferroelectric material film may include 2 at % to 10 at % silicon. When the dopant is yttrium (Y), the ferroelectric material film may include 2 at % to 10 at % yttrium. When the dopant is gadolinium (Gd), the ferroelectric material film may include 1 at % to 7 at % gadolinium. When the dopant is zirconium (Zr), the ferroelectric material film may include 50 at % to 80 at % zirconium.

The paraelectric material film may have paraelectric properties. The paraelectric material film may include, e.g., at least one of a silicon oxide and a metal oxide having a high dielectric constant. The metal oxide included in the paraelectric material film may include, e.g., at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, e.g., 0.5 nm to 10 nm. Since a critical thickness that exhibits the ferroelectric properties may vary for each ferroelectric material, the thickness of the ferroelectric material film may vary depending on the ferroelectric material.

In an embodiment, the gate dielectric film 130 may include a single ferroelectric material film. In another embodiment, the gate dielectric film 130 may include a plurality of ferroelectric material films spaced apart from each other. The gate dielectric film 130 may have a stacked film structure in which a plurality of ferroelectric material films and a plurality of paraelectric material films are alternately stacked.

The gate spacer 150 may be formed on the second epitaxial layer 104 and the field insulating film 115. The gate spacer 150 may extend along the side surfaces of the gate electrode 140. In some embodiments, a part of the gate dielectric film 130 may be interposed between the gate electrode 140 and the gate spacer 150. For example, the gate dielectric film 130 may further extend along at least a part of the inner surface of the gate spacer 150. Such a gate dielectric film 130 may be formed by, e.g., the replacement process. The gate spacer 150 may include at least one insulating material, e.g., at least one of silicon nitride, silicon oxynitride, silicon oxycarbide, silicon boron nitride, silicon boron carbonitride, silicon oxycarbonitride, and combinations thereof.

The gate capping film 160 may be formed on the gate electrode 140. The gate capping film 160 may extend along the upper surface of the gate electrode 140. For example, as illustrated in FIG. 6, the gate spacer 150 may cover the side surfaces of the gate capping film 160. In another example, the gate capping film 160 may be formed to cover the upper surface of the gate spacer 150. The gate capping film 160 may include an insulating material, e.g., at least one of silicon nitride, silicon oxynitride, silicon oxycarbide, silicon boron nitride, silicon boron carbonitride, silicon oxycarbonitride, and combinations thereof.

The source/drain region 170 may be formed on the upper surface of the second epitaxial layer 104 and on at least one side surface (e.g., both side surfaces) of the gate electrode 140. The source/drain region 170 may be connected to each active pattern 120. For example, the first to fourth sheet patterns 121 to 124 may each penetrate the gate electrode 140 and be connected to the source/drain region 170. The source/drain region 170 may be spaced apart from the gate electrode 140 by the gate dielectric film 130 and/or the gate spacer 150.

In some embodiments, an internal spacer 145 may be formed on the side surfaces of the gate electrode 140 between the active patterns 120. The internal spacer 145 may also be formed between the fin pattern 120F and the active patterns 120 (e.g., between the fin pattern 120F and the first sheet pattern 121). The gate electrode 140 between the active patterns 120 may be spaced apart from the source/drain region 170 by the gate dielectric film 130 and the internal spacer 145. For example, as illustrated in FIG. 7, the thickness of the internal spacer 145 may be the same as the thickness of the gate spacer 150. In another example, the internal spacer 145 may be omitted.

In some embodiments, the source/drain region 170 may be an epitaxial pattern formed by an epitaxial growth process. For example, the source/drain region 170 may be formed from the second epitaxial layer 104 by the epitaxial growth process. For example, as illustrated in FIG. 6, the cross section of the source/drain region 170 may be a pentagon. In another example, the cross section of the source/drain region 170 may have various shapes, e.g., a hexagonal shape and a diamond shape, depending on the epitaxial growth conditions.

When the electronic element formed on the second epitaxial layer 104 is a p-type (e.g., when the first well region 106A includes n-type impurities), the source/drain region 170 may include p-type impurities or impurities for preventing the diffusion of p-type impurities. For example, the source/drain region 170 may include at least one of B, C, In, Ga, Al, and combinations thereof.

In some embodiments, when the electronic element formed on the second epitaxial layer 104 is the p-type, the source/drain region 170 may include a compressive stress material. For example, when the active pattern 120 is a silicon pattern, the source/drain region 170 may include a material (e.g., silicon germanium (SiGe)) having a higher lattice constant than silicon (Si). The compressive stress material may apply compressive stress to each active pattern 120 to improve carrier mobility of the channel region.

When the electronic element formed on the second epitaxial layer 104 is the n-type (e.g., when the well regions 106A and 106B include p-type impurities), the source/drain region 170 may include n-type impurities or impurities for preventing the diffusion of n-type impurities. For example, the source/drain region 170 may include at least one of P, Sb, As, and a combination thereof.

In some embodiments, when the electronic element formed on the second epitaxial layer 104 is the n-type, the source/drain region 170 may include a tensile stress material. For example, when the active pattern 120 is a silicon pattern, the source/drain region 170 may include a material (e.g., silicon carbide (SiC)) having a lower lattice constant than silicon (Si). The tensile stress material may apply a tensile stress to the active pattern 120 to improve carrier mobility of the channel region.

The interlayer insulating film 190 may be formed on the second epitaxial layer 104 and the field insulating film 115. The interlayer insulating film 190 may be formed to fill the space on the outer surface of the gate spacer 150. For example, the interlayer insulating film 190 may cover the second epitaxial layer 104, the field insulating film 115, and the source/drain region 170. For example, as illustrated in FIG. 7, the interlayer insulating film 190 may expose the upper surface of the gate capping film 160. In another example, the interlayer insulating film 190 may cover the upper surface of the gate capping film 160.

The interlayer insulating film 190 may include, e.g., at least one of silicon oxide, silicon nitride, silicon oxynitride, silicon oxycarbide, silicon boron nitride, silicon boron carbonitride, silicon oxycarbonitride, and a low dielectric constant material. The low dielectric constant material may include, e.g., at least one of FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

The source/drain contact 180 may be connected to the source/drain region 170. For example, the source/drain contact 180 may extend in the third direction Z to penetrate the interlayer insulating film 190 and be in contact with the source/drain region 170.

The body contact 185 may be connected to the well regions 106A and 106B in the second epitaxial layer 104. For example, the body contact 185 may extend in the third direction Z to penetrate the interlayer insulating film 190, and come into contact with the well regions 106A and 106B in the second epitaxial layer 104.

For example, as illustrated in FIG. 6, the source/drain contacts 180 and body contacts 185 may each be a single film. In another example, the source/drain contact 180 and the body contact 185 may each include a silicide film and a penetrating conductive film, which are stacked sequentially. The silicide film may include, e.g., platinum (Pt), nickel (Ni), cobalt (Co), and the like. The penetrating conductive film may include, e.g., titanium (Ti), titanium nitride (TiN), tungsten (W), aluminum (Al), copper (Cu), and the like.

In some embodiments, the source/drain contact 180 and the body contact 185 may be formed at the same level. As used herein, the term "same level" means a level formed by the same fabricating process.

The body contact 185 may apply a body bias voltage to the well regions 106A and 106B in the second epitaxial layer 104. For example, the body contact 185 may correspond to the well contacts 190A and 190B of FIG. 4. As a result, the well regions 106A and 106B may be provided as the body of the electronic elements (e.g., the electronic elements TR1 and TR2 of FIG. 5) formed on the second epitaxial layer 104.

Hereinafter, a semiconductor device including a semiconductor substrate according to exemplary embodiments will be described referring to FIGS. 1 to 12. FIGS. 9 to 12 are intermediate step diagrams for explaining a method for fabricating a semiconductor substrate according to some embodiments. For convenience of explanation, parts explained previously with reference to FIGS. 1 to 8 will be only briefly described or omitted.

Figure 9:
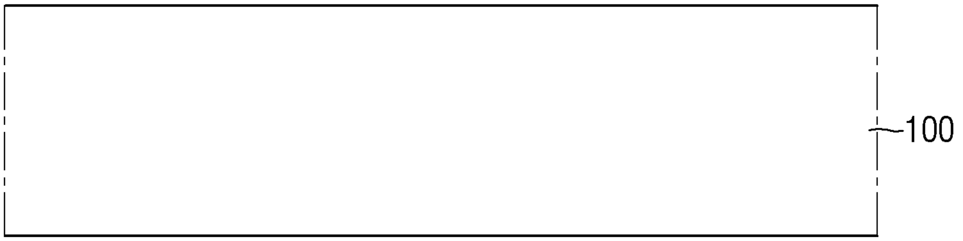
FIGS. 9 to 12 are diagrams for explaining a method for fabricating a semiconductor substrate according to some embodiments.

Referring to FIG. 9, the base substrate 100 may be provided. For example, the base substrate 100 may be bulk silicon or silicon-on-insulator (SOI). In another example, the base substrate 100 may be a silicon substrate, or may include other materials, e.g., silicon germanium, silicon germanium on insulator (SGOI), indium antimonide, lead tellurium compounds, indium arsenide, indium phosphide, gallium arsenide or gallium antimonide. As an example, the base substrate 100 will be described below as a single crystal silicon substrate.

Figure 10:
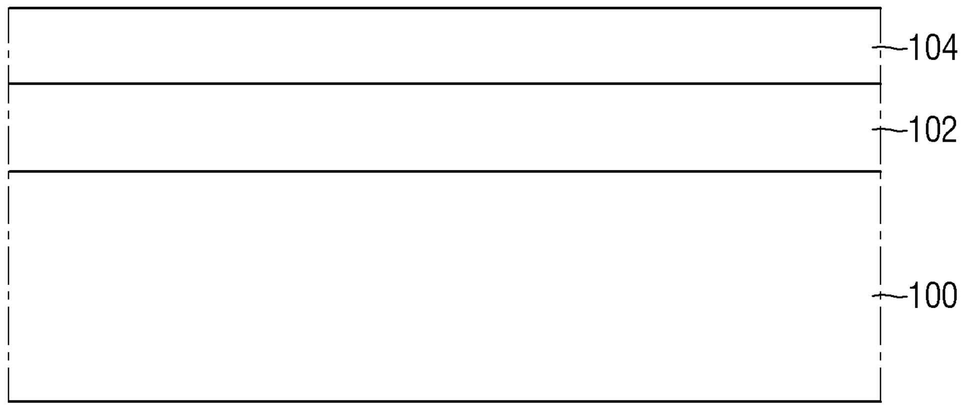
Figure 11:
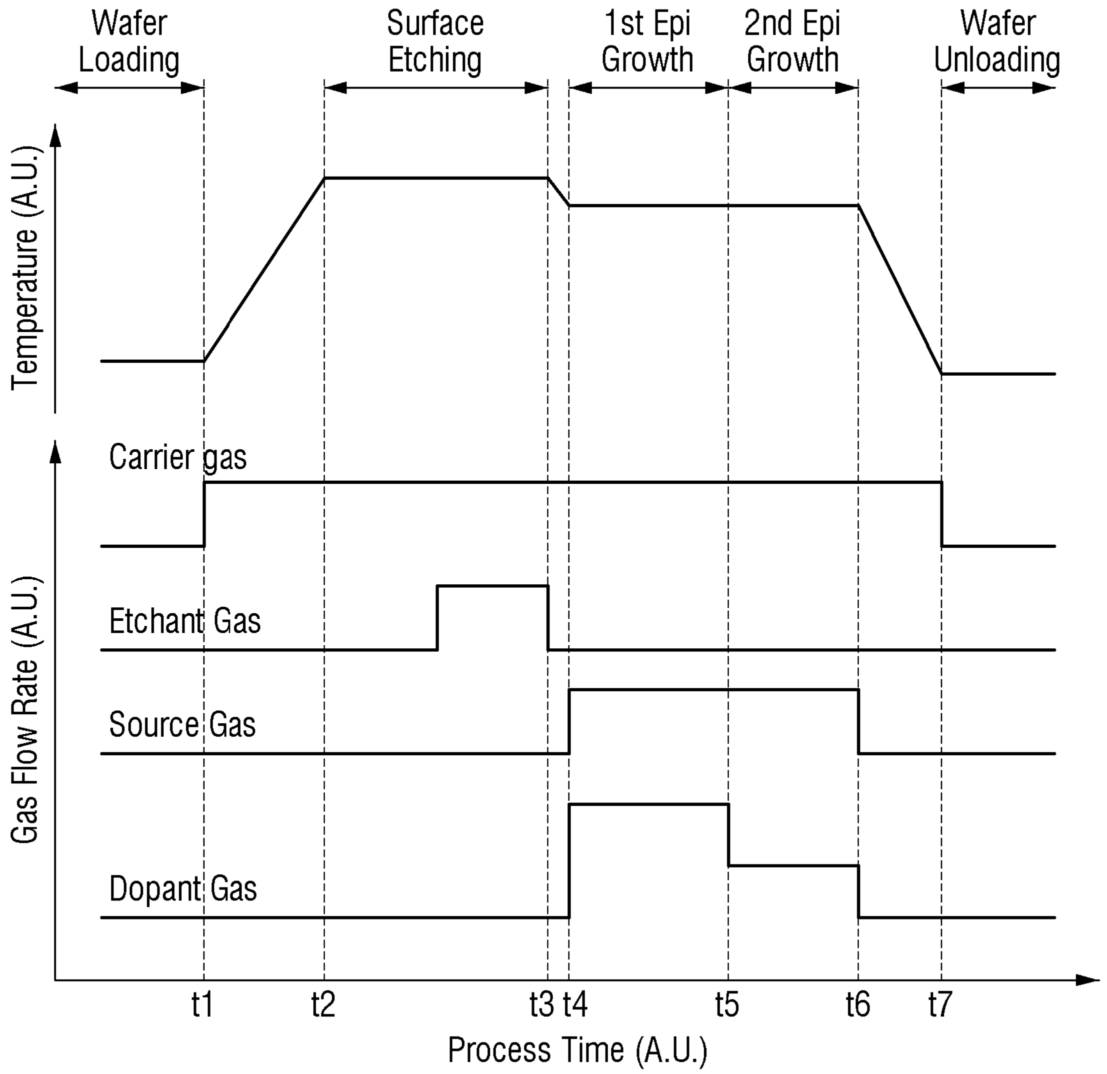

Referring to FIGS. 10 and 11, the first epitaxial layer 102 and the second epitaxial layer 104 may be formed on the base substrate 100. For reference, FIG. 11 shows exemplary process steps for forming the first epitaxial layer 102 and the second epitaxial layer 104.

First, a wafer including the base substrate 100 may be loaded. After the wafer is loaded, carrier gas may be supplied onto the wafer. The carrier gas may include, e.g., $H_2$ or $N_2$ of high purity.

In some embodiments, after the carrier gas is supplied, the process temperature of the wafer may be set to a predetermined temperature (i.e., a first temperature). For example, the process temperature of the wafer may increase from room temperature to the first temperature, for predetermined times t1 to t2 from the time point at which the carrier gas is supplied.

When the process temperature of the wafer is set to the first temperature, a surface etching process on the wafer may be performed. For example, the etchant gas may be supplied onto the wafer for the times t2 to t3 at which the first temperature is maintained. The etchant gas may be supplied through the carrier gas. The etchant gas may include, e.g., HCl, HF, Hbr, $SF_6$, $Cl_2$ or the like.

In some embodiments, after the surface etching process has been performed, the process temperature of the wafer may be set to a predetermined temperature (i.e., a second temperature) different from the first temperature. For example, the process temperature of the wafer may decrease from the first temperature to the second temperature, for predetermined times t3 to t4 from the time point at which the supply of etchant gas is interrupted.

When the process temperature of the wafer is set to the second temperature, the epitaxial growth process on the wafer may be performed. For example, the source gas and the dopant gas may be supplied onto the wafer for times t4 to t6 at which the second temperature is maintained. The source gas and the dopant gas may be supplied through the carrier gas. As a result, the first epitaxial layer 102 and the second epitaxial layer 104 having the first conductivity type (e.g., p-type) may each be grown on the base substrate 100. In some embodiments, the first epitaxial layer 102 and the second epitaxial layer 104 may be formed in-situ.

The source gas may provide the elemental semiconductor material of the first epitaxial layer 102 and/or the elemental semiconductor material of the second epitaxial layer 104. For example, the source gas may include $SiH_4$, $SiH_2Cl_2$, $SiHCl_3$, $SiCl_4$, $GeH_4$ or the like.

The dopant gas may provide impurities of the first epitaxial layer 102 and/or impurities of the second epitaxial layer 104. For example, when the first conductivity type is the p-type, the dopant gas may include, e.g., boron (B), gallium (Ga), indium (In), aluminum (Al), or the like.

In some embodiments, the flow rate of the dopant gas supplied onto the wafer may decrease for the times t4 to t6 at which the epitaxial growth process is performed. For example, the dopant gas of the first flow rate may be supplied for predetermined times t4 to t6 from the time point at which the source gas and the dopant gas are supplied. While the dopant gas of the first flow rate is being supplied, a first epitaxial growth process of growing the first epitaxial layer 102 from the base substrate 100 may be performed. Subsequently, the dopant gas of a second flow rate smaller than the first flow rate may be supplied for predetermined times t5 to t6 from the time point at which the first epitaxial growth process is completed. While the dopant gas of the second flow rate is being supplied, a second epitaxial growth process of growing the second epitaxial layer 104 from the first epitaxial layer 102 may be performed. Through the first epitaxial growth process and the second epitaxial growth process, the first epitaxial layer 102 may have a doping concentration of a relatively higher level than that of the second epitaxial layer 104.

In some embodiments, after the epitaxial growth process is performed, the process temperature of the wafer may be set to a predetermined temperature (i.e., a third temperature) different from the second temperature. For example, the process temperature of the wafer may decrease from the second temperature to room temperature, for predetermined times t6 to t7 from the time point at which the supply of the source gas and/or the dopant gas is interrupted.

When the process temperature of the wafer is set to the third temperature (e.g., room temperature), the wafer including the base substrate 100, the first epitaxial layer 102, and the second epitaxial layer 104 may be unloaded.

Although the first epitaxial layer 102 and the second epitaxial layer 104 are only explained as being formed in-situ, this is merely an example. As another example, the first epitaxial growth process and the second epitaxial growth process may not be performed continuously. As yet another example, the first epitaxial growth process and the second epitaxial growth process may use different source gases and/or different dopant gases from each other.

Figure 12:
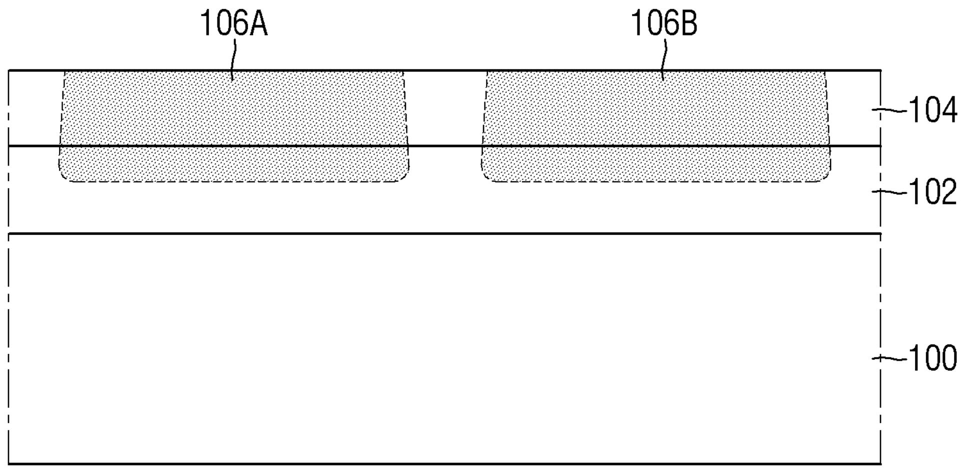

Referring to FIG. 12, the well regions 106A and 106B are formed in the first epitaxial layer 102 and the second epitaxial layer 104. For example, an ion implantation process of implanting impurities of the second conductivity type into the first epitaxial layer 102 and the second epitaxial layer 104 may be performed. Therefore, the well regions 106A and 106B having the second conductivity type (e.g., n-type) may be formed.

By way of summation and review, high integration of semiconductor devices may require a reduced interval between well regions. However, the reduced interval between the well regions may form a leakage path between adjacent well regions, thereby causing defects of electronic elements.

Therefore, aspects of embodiments provide a semiconductor substrate which has improved performance by blocking a leakage path between well regions. Aspects of embodiments also provide a semiconductor device including a semiconductor substrate which has improved performance by blocking a leakage path between well regions. Aspects of embodiments also provide a method for fabricating a semiconductor substrate which has improved performance by blocking a leakage path between well regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor substrate, comprising:

a base substrate;

a first epitaxial layer on the base substrate, the first epitaxial layer having a first conductivity type;

a second epitaxial layer on the first epitaxial layer, the second epitaxial layer having the first conductivity type;

a first well region in the first epitaxial layer and the second epitaxial layer, the first well region having a second conductivity type different from the first conductivity type; and a second well region in the first epitaxial layer and the second epitaxial layer, the second well region having the second conductivity type and being spaced apart from the first well region, wherein the base substrate has the first conductivity type, wherein a doping concentration of the first epitaxial layer is greater than a doping concentration of the second epitaxial layer, and wherein a depth of each of the first well region and the second well region is greater than a thickness of the second epitaxial layer.

2. The semiconductor substrate as claimed in claim 1, wherein the doping concentration of the first epitaxial layer is greater than a doping concentration of the base substrate.

3. The semiconductor substrate as claimed in claim 1, wherein a thickness of the first epitaxial layer is 0.1 μm to 2.0 μm.

4. The semiconductor substrate as claimed in claim 1, wherein the thickness of the second epitaxial layer is 0.1 μm to 1.0 μm.

5. The semiconductor substrate as claimed in claim 1, wherein the doping concentration of the first epitaxial layer is 1E16 $cm^{-3}$ to 1E21 $cm^{-3}$.

6. The semiconductor substrate as claimed in claim 1, wherein the doping concentration of the second epitaxial layer is 1E11 $cm^{-3}$ to 1E17 $cm^{-3}$.

7. The semiconductor substrate as claimed in claim 1, wherein a separation distance between the first well region and the second well region is 0.15 μm or less.

8. The semiconductor substrate as claimed in claim 1, wherein the first conductivity type is a p-type, and the second conductivity type is an n-type.

9. A semiconductor substrate, comprising:
- a base substrate having a first conductivity type;
- a first epitaxial layer on the base substrate, the first epitaxial layer having the first conductivity type;
- a second epitaxial layer on the first epitaxial layer, the second epitaxial layer having the first conductivity type; and
- a well region which extends from an upper surface of the second epitaxial layer toward the base substrate, the well region having a second conductivity type different from the first conductivity type,
- wherein a doping concentration of the first epitaxial layer is greater than a doping concentration of the second epitaxial layer,
- wherein a thickness of the first epitaxial layer is 0.1 μm to 2.0 μm,
- wherein a thickness of the second epitaxial layer is 0.1 μm to 1.0 μm, and
- wherein a depth of the well region is greater than the thickness of the second epitaxial layer.

10. The semiconductor substrate as claimed in claim 9, wherein the doping concentration of the first epitaxial layer is greater than a doping concentration of the base substrate.

11. The semiconductor substrate as claimed in claim 9, wherein a lower surface of the well region is between a lower surface of the first epitaxial layer and an upper surface of the first epitaxial layer.

12. The semiconductor substrate as claimed in claim 9, wherein the doping concentration of the first epitaxial layer is 1E17 $cm^{-3}$ to 1E20 $cm^{-3}$, and the doping concentration of the second epitaxial layer is 1E13 $cm^{-3}$ to 1E17 $cm^{-3}$.

13. The semiconductor substrate as claimed in claim 9, wherein:
- the second epitaxial layer includes a transition layer and a body layer which are sequentially stacked on the first epitaxial layer, and
- a doping concentration of the transition layer increases from the body layer toward the first epitaxial layer.

14. The semiconductor substrate as claimed in claim 9, wherein a width of the well region increases toward the base substrate.

15. A semiconductor device, comprising:
- a base substrate;
- a first epitaxial layer on the base substrate, the first epitaxial layer having a first conductivity type;
- a second epitaxial layer on the first epitaxial layer, the second epitaxial layer having the first conductivity type;
- a first well region having a second conductivity type different from the first conductivity type, the first well region being in the first epitaxial layer and the second epitaxial layer; and
- a first element on the first well region, the first element including:
- active patterns sequentially stacked on the first epitaxial layer and spaced apart from each other,
- a gate electrode which intersects each of the active patterns and surrounds side surfaces of each of the active patterns, and
- a source/drain region connected to each of the active patterns and having the first conductivity type, on side surfaces of the gate electrode,
- wherein a doping concentration of the first epitaxial layer is greater than a doping concentration of the second epitaxial layer, and
- wherein a depth of the first well region is greater than a thickness of the second epitaxial layer.

16. The semiconductor device as claimed in claim 15, further comprising:
- a second well region in the first epitaxial layer and the second epitaxial layer, the second well region being spaced apart from the first well region and having the second conductivity type; and
- a second element of the first conductivity type on the second well region.

17. The semiconductor device as claimed in claim 16, wherein a separation distance between the first well region and the second well region is 0.15 μm or less.

18. The semiconductor device as claimed in claim 16, wherein the first conductivity type is a p-type, the second conductivity type is an n-type, and each of the first element and the second element is a p-type.

19. The semiconductor device as claimed in claim 15, wherein:
- a thickness of the first epitaxial layer is 0.1 μm to 2.0 μm,
- the thickness of the second epitaxial layer is 0.1 μm to 1.0 μm,
- the doping concentration of the first epitaxial layer is 1E17 $cm^{-3}$ to 1E20 $cm^{-3}$, and
- the doping concentration of the second epitaxial layer is 1E13 $cm^{-3}$ to 1E17 $cm^{-3}$.

* * * * *